United States Patent [19]

Omata

[11] Patent Number: 5,628,634
[45] Date of Patent: May 13, 1997

[54] ROTARY PROBE, PRINTED CIRCUIT BOARD ON WHICH THE ROTARY PROBE IS MOUNTED, AND CONNECTING DEVICE INCORPORATING THE ROTARY PROBE

[75] Inventor: Haruyoshi Omata, Toyota, Japan

[73] Assignee: Fujitsu Limited, Kawasaki, Japan

[21] Appl. No.: 279,360

[22] Filed: Jul. 25, 1994

[30] Foreign Application Priority Data

Sep. 2, 1993 [JP] Japan ................... 5-218743

[51] Int. Cl.⁶ ........................................... H01R 39/00
[52] U.S. Cl. ......................... 439/13; 439/482; 324/149
[58] Field of Search ............................. 439/13, 20, 21, 439/22, 52, 482; 200/110, 110 A, 11 R, 51.06; 324/754, 538, 72.5, 149

[56] References Cited

U.S. PATENT DOCUMENTS

| | | | |
|---|---|---|---|
| 3,414,806 | 12/1968 | Carr | 439/955 X |
| 4,840,569 | 6/1989 | Cabourne | 439/65 |
| 5,148,103 | 9/1992 | Pasiecznik, Jr. | 324/158 P |
| 5,394,070 | 2/1995 | Jacobsen et al. | 200/11 R |

*Primary Examiner*—Khiem Nguyen
*Attorney, Agent, or Firm*—Staas & Halsey

[57] ABSTRACT

In a rotary probe mounted on a circuit board and used to connect a circuit of the circuit board to an external device, an outer frame has a flange portion facing the circuit board. A first lead extends along the flange portion and has a signal input terminal and is supported so as to be rotatable with respect to the circuit board. The signal input terminal is connectable to parts of the circuit of the circuit board one by one by rotating the first lead. A probing jack is connected to the first lead, and is connectable to a corresponding terminal formed on the circuit board. A ground supply terminal projects from the outer frame and is connectable to a corresponding ground terminal formed on the circuit board.

28 Claims, 8 Drawing Sheets

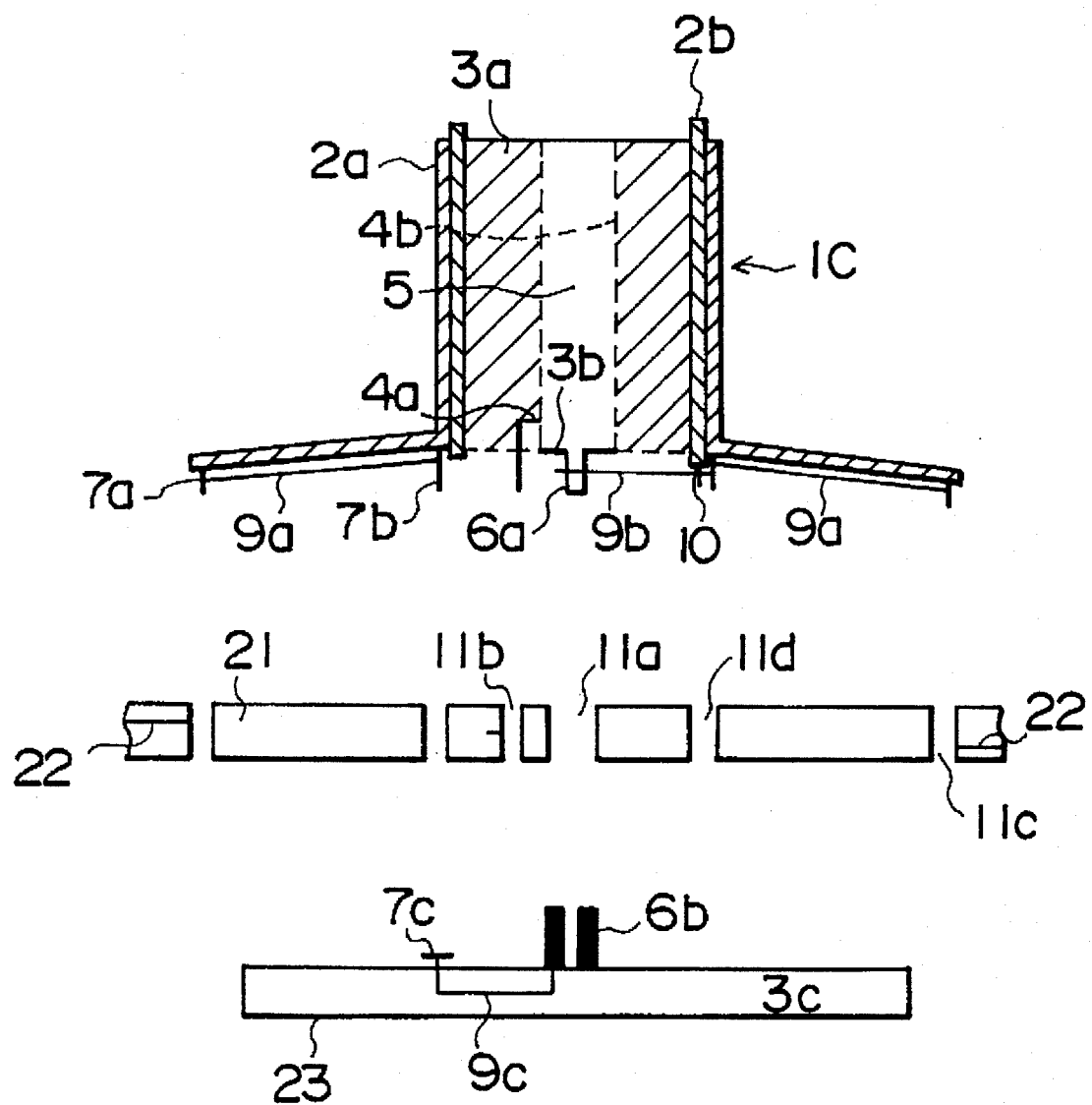

ROTARY PROBE, PRINTED CIRCUIT BOARD ON WHICH THE ROTARY PROBE IS MOUNTED, AND CONNECTING DEVICE INCORPORATING THE ROTARY PROBE

BACKGROUND OF THE INVENTION

1. Field of the Invention

The present invention relates to a rotary probe used to interconnect a measurement point of a circuit to be measured and a probe of a measuring device. Further, the present invention is concerned with a printed circuit board suitable for mounting such a rotary probe thereon, and a connecting device incorporating the rotary probe.

2. Description of the Prior Art

Conventionally, a probe of a measuring device is connected directly to a measurement point of a circuit to be measured. Another measuring method has been proposed in which a rotary switch is connected between measurement points of a circuit to be tested and the probe of the measuring device. The measurement points are manually connected to the rotary switch by lead wires such as Teflon-coated lead wires or enamel-coated wires.

However, manual connecting work is troublesome and thus efficient measuring work cannot be done. Also, the rotary switch occupies space on the measured printed circuit board. Further, there is a distance in the order of a centimeter between the rotary switch and the probe of the measuring device. The above distance degrades the accuracy of measurement.

SUMMARY OF THE INVENTION

It is a general object of the present invention to provide a rotary probe in which the above disadvantages are eliminated.

A more specific object of the present invention is to provide a compact rotary probe making it possible to efficiently measure a circuit with high accuracy.

The above objects of the present invention are achieved by a rotary probe mounted on a circuit board and used to connect a circuit of the circuit board to an external device, the rotary probe comprising:

an outer frame having a flange portion facing the circuit board;

a first lead extending along the flange portion and having a signal input terminal and being supported so as to be rotatable with respect to the circuit board, the signal input terminal being connectable to parts of the circuit of the circuit board one by one by rotating the first lead;

a probing jack connected to the first lead, and connectable to a corresponding terminal formed on the circuit board; and a ground supply terminal projecting from the outer frame and being connectable to a corresponding ground terminal formed on the circuit board.

The above objects of the present invention are also achieved by a rotary probe mounted on a circuit board and used to connect a circuit of the circuit board to an external device, the rotary probe comprising:

an outer frame having a flange portion facing the circuit board;

a first inner frame rotatably provided in a hollow portion of the outer frame;

first leads extending along the flange portion and being connected to first and second terminals supported by the flange portion;

a second lead fixed to the first inner frame;

a probing jack connected to the second lead and connectable to a corresponding terminal formed on the circuit board, the second lead being rotated about the probing jack by turning the first inner frame and coming into contact with the first terminals one by one; and a ground supply terminal projecting from the outer frame and being connectable to a corresponding ground terminal formed on the circuit board.

Another object of the present invention is to provide a circuit board suitable for the above rotary probe.

This object of the present invention is achieved by a circuit board on which a rotary probe is mounted, the rotary probe comprising: an outer frame having a flange portion facing the circuit board; a first lead extending along the flange portion and having a signal input terminal and being supported so as to be rotatable with respect to the circuit board, the signal input terminal being connectable to parts of the circuit of the circuit board one by one by rotating the first lead; a probing jack connected to the first lead and connectable to a corresponding probing jack socket formed on the circuit board; and a ground supply terminal projecting from the outer frame and being connectable to a corresponding ground terminal formed on the circuit board. The circuit board further comprises:

a plurality of terminals formed on a board and arranged on an imaginary curved line drawn by the signal input terminal by rotating the lead;

wiring lines connecting the plurality of terminals to the circuit of the circuit board;

a first hole formed in the board, the probing jack being inserted into the first hole; and a second hole formed in the board, the ground supply terminal being inserted into the second hole.

The above object of the present invention is also achieved by a circuit board on which a rotary probe is mounted, the rotary probe comprising: an outer frame having a flange portion facing the circuit board; a first inner frame rotatably provided in a hollow portion of the outer frame; first leads extending along the flange portion and being connected to first and second terminals supported by the flange portion; a second lead fixed to the first inner frame; a probing jack connected to the second lead and connectable to a corresponding terminal formed on the circuit board, the second lead being rotated about the probing jack by turning the first inner frame and connectable to the first terminals one by one; and a ground supply terminal projecting from the outer frame and being connectable to a corresponding ground terminal formed on the circuit board. The circuit board further comprises:

a plurality of third terminals formed on a board and located at positions corresponding to the first terminals;

a plurality of fourth terminals formed on the board and located at positions corresponding to the second terminals;

wiring lines connecting the plurality of fourth terminals to the circuit of the circuit board;

a first hole formed in the board, the probing jack being inserted into the first hole; and a second hole formed in the board, the ground supply terminal being inserted into the second hole.

Yet another object of the present invention is to provide a connecting device using the above rotary probe.

This object of the present invention is achieved by a connecting device comprising:

a rotary probe mounted on a circuit board and used to connect a circuit of the circuit board to an external device; and an under wheel located on a first end of the circuit board, the rotary probe being located on a second end of the circuit board opposite to the first end. The rotary probe further comprises:

an outer frame having a flange portion facing the circuit board;

a first lead extending along the flange portion and having a first signal input terminal connectable to a part of the circuit of the circuit board and being supported so as to be rotatable with respect to the circuit board;

a probing jack connected to the first lead; and a ground supply terminal projecting from the outer frame and being connectable to a corresponding ground terminal formed on the circuit board. The under wheel further comprises:

a second signal input terminal connectable to another part of the circuit of the circuit board;

a probing jack socket connectable to the probing jack through the circuit board; and an inner lead connecting the second signal input terminal and the probing jack socket.

The just above object of the present invention is also achieved by a connecting device comprising:

a rotary probe mounted on a circuit board and used to connect a circuit of the circuit board to an external device; and an under wheel located on a first end of the circuit board, the rotary probe being located on a second end of the circuit board opposite to the first end. The rotary probe further comprises:

an outer frame having a flange portion facing the circuit board;

a first inner frame rotatably provided in a hollow portion of the outer frame;

first leads extending along the flange portion and being connected to first and second terminals supported by the flange portion;

a second lead fixed to the first inner frame;

a probing jack connected to the second lead and connectable to a corresponding terminal formed on the circuit board, the second lead being rotated about the probing jack by turning the first inner frame and coming into contact with the first terminals one by one; and a ground supply terminal projecting from the outer frame and being connectable to a corresponding ground terminal formed on the circuit board. The under wheel further comprises:

a signal input terminal connectable to another part of the circuit of the circuit board;

a probing jack socket connectable to the probing jack through the circuit board; and an inner lead connecting the signal input terminal and the probing jack socket.

BRIEF DESCRIPTION OF THE DRAWINGS

Other objects, features and advantages of the present invention will become more apparent from the following detailed description when read in conjunction with the accompanying drawings, in which:

FIG. 15 is a diagram showing a combination of the rotary probe according to the fourth embodiment of the present invention and an under wheel.

DESCRIPTION OF THE PREFERRED EMBODIMENTS

Figure 1A:
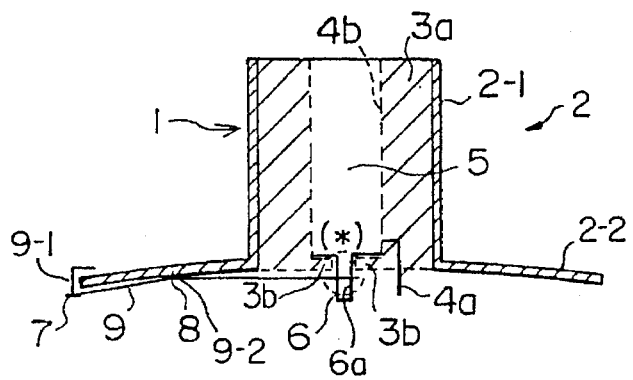
FIG. 1A is a cross-sectional view of a rotary probe according to a first embodiment of the present invention.

A description will now be given, with reference to FIGS. 1A, 1B and 2, of a rotary probe according to a first embodiment of the present invention.

A rotary probe 1 has an outer frame 2 made of an electrically insulating material such as plastic or rubber. The outer frame 2 has a hollow cylindrical portion 2-1 and a disk-shaped flange portion 2-2 extending radially outwardly from the lower end of the cylindrical portion. An electrically insulating member 3a having a hollow cylindrical shape is disposed inside the hollow cylindrical portion 2-1 of the outer frame 2. The insulating member 3a has a cylindrical hole located in the center thereof (i.e., coaxially therein). The cylindrical hole of the insulating member 3a serves as a probe socket 5. A metallic layer 4b for a ground supply is formed on the inner circumferential surface portion of the probe socket 5. The metallic layer 4b is made of, for example, copper or gold. A ground supply terminal 4a extends from the ground supply metallic layer 4b to the outer frame 2 via the insulating member 3a, so that the metallic layer 4b can be set to the ground potential. The outer frame 2 may be fixed to the insulating member 3a or may be rotatable relatively thereto. An electrically insulating member 3b serving as a lid (i.e., an enclosure) is provided so that it covers the bottom of the probe socket 5. A metallic probing jack 6 penetrates the center of the insulating member 3b and is supported by the insulating member 3b. A probe of a measuring device is inserted into the probe socket 5, by which a signal terminal of the measuring device probe is inserted into a recess 6a of the probing jack 6 and a ground terminal thereof, formed around the signal terminal, comes into contact with the metallic layer 4b.

A lead 9 is electrically connected to the probing jack 6 so that the lead 9 is rotatable relatively to the jack 6. A signal input terminal 7 is attached to an end of the lead 9, which has a portion 9-1 bent into an approximately C shape so that the circular outer end (i.e., the circular periphery) of the disk portion 2-2 of the outer frame 2 is inserted into (i.e., received in sliding engagement in) the C-shaped end portion 9-1 of the lead 9. The signal input terminal 7 has an appropriate shape for facilitating contact with parts of circuits of the printed circuit board, such as a plate shape or a curved shape. The lead 9 is slightly bent at an intermediate portion 9-2 thereof so that the lead 9 functions as a leaf spring. The above intermediate portion 9-2 is in contact, at application point 8, with the disk portion 2-2 of the outer frame 2 and presses the signal input terminal 7 against a through hole 11c (see FIG. 3) formed on a printed circuit board having a circuit to be measured. In other words, the signal input terminal 7 is urged downwardly (toward the printed circuit board) by the bent portion 9-2, as engaged against application point 8. The through hole 11c is a measurement point. Hence, the signal input terminal 7 makes a strong, firm contact with the through hole 11c. An observation (i.e., monitoring) signal obtained at the through hole 11c is transferred to the probe of the measuring device via the lead 9 and the probing jack 6 into which the above probe is inserted. When force is exerted on the C-shaped end portion 9-1 of the lead 9 in the circular (i.e., circumferential, or rotational) direction, the lead 9 is rotated about the center of the rotary probe 1 together with the probing jack 6.

Figure 1B:
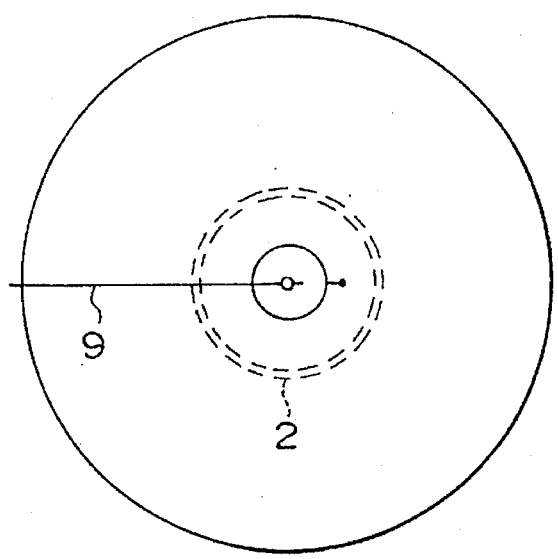
FIG. 1B is a bottom view of the rotary probe shown in FIG. 1A.
Figure 2:
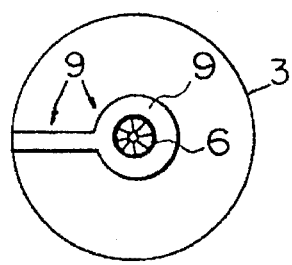
FIG. 2 is a diagram showing connection of a probing jack to a lead shown in FIG. 1A.

FIG. 2 shows in detail a part, encompassed by a dashed circular line, as shown in FIG. 1A. The lead 9 has a ring-shaped end portion 9-3 opposite to the C-shaped end portion 9-1 (see FIG. 1A) thereof. The probing jack 6 is inserted into the ring-shaped end portion of the lead 9 and is electrically connected thereto. When the probe of the measuring device is inserted into the probe socket 5, a needle part of the probe of the measuring device comes into contact with the probing jack 6, and the outside ground portion of the probe of the measuring device comes into contact with the ground supply metallic layer 4b.

Figure 3:
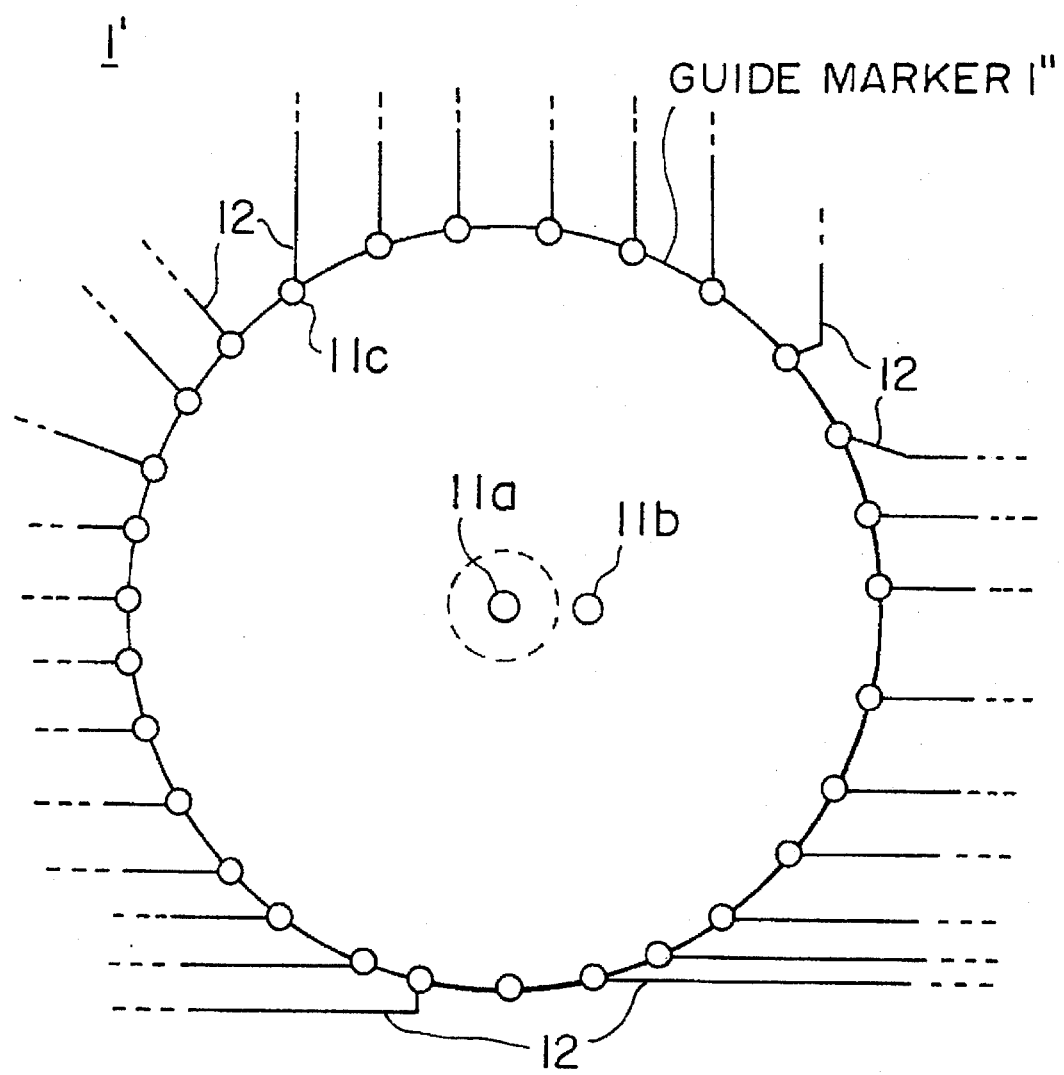
FIG. 3 is a plan view of a part of a printed circuit board suitable for rotary probes according to the first embodiment of the present invention and also to another embodiment thereof.

FIG. 3 is a plan view of a part of a printed circuit board 1'. The printed circuit board 1' shown in FIG. 3 is used to mount the rotary probe 1 shown in FIGS. 1A, 1B and 2. The printed circuit board shown in FIG. 3 has a through hole 11a, a ground through hole 11b, a plurality of through holes 11c for measurement, and printed wiring lines 12 formed on a board.

The through holes 11c, which are measurement points, are arranged in a circular form along a guide marker 1". The through holes 11c are disposed at spaced locations along a circle which coincides with a circle drawn by rotating the signal input terminal 7 about an axis of rotation defined by the jack 6. Instead of the through holes 11c, via holes or lands may be formed. The signal input terminal 7 of the lead 9 can come into contact with any one of the through holes 11c. The printed wiring lines 12, extending from respective through holes 11c as measurement points, are electrically connected to parts of circuits formed on the printed circuit board.

The through hole 11a is located in the center of the circular arrangement of the through holes 11c. The probing jack 6 shown in FIG. 1A is inserted into the through hole 11a and is soldered. The ground through hole 11b (which may be a via hole) is located at a position slightly apart from the through hole 11a. The ground through hole 11b is connected to a ground layer (not shown) of the printed circuit board. The electrical connection with the ground layer can be provided on either or both of the upper and lower surfaces of the printed circuit board by means of the ground through hole 11b. The ground supply terminal 4a shown in FIG. 1A is inserted into the ground through hole 11b and is soldered thereto.

Figure 4A:
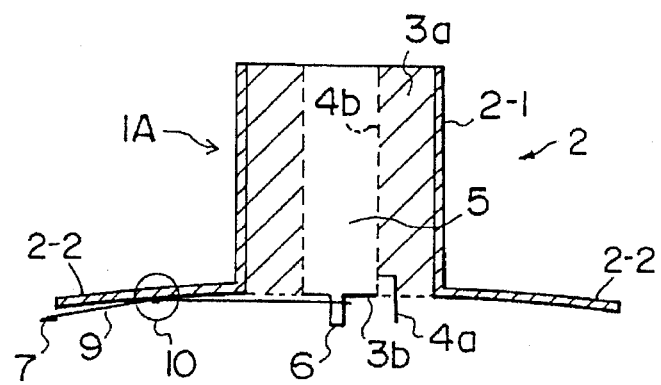
FIG. 4A is a cross-sectional view of a rotary probe according to a second embodiment of the present invention.
Figure 4B:
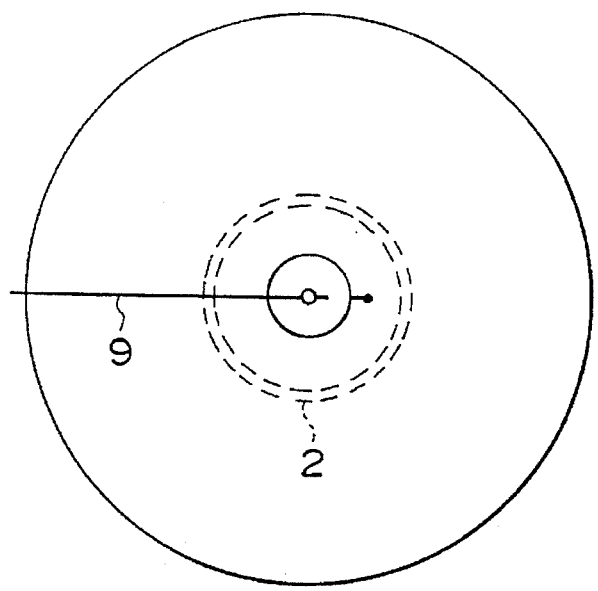
FIG. 4B is a plan view of the rotary probe shown in FIG. 4A.
Figure 5:
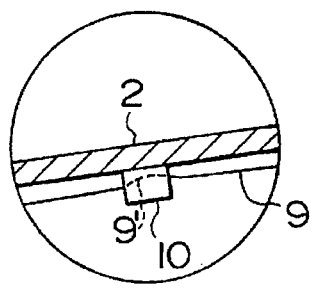
FIG. 5 is a diagram showing the relation between a lead and a lead guide used in the second embodiment of the present invention.

A description will now be given, with reference to FIGS. 4A, 4B and 5, of a rotary probe 1A according to a second embodiment of the present invention. In these figures, parts that are the same as those shown in the previously described figures are given the same reference numerals. The second embodiment of the present invention differs from the first embodiment thereof in the following points. First, the lead 9 of the second embodiment of the present invention does not have the approximately C-shaped end portion. Second, a lead guide 10 is attached to the bottom surface of the disk-shaped flange portion 2-2 of the outer frame 2. As shown in FIG. 5, portion 9' of the lead 9 transversely penetrates the lead guide 10. Hence, the lead 9 is substantially fixed to the flange portion 2-2 the outer frame 2. The outer frame 2 can be rotated like a range switching knob of an oscilloscope.

The rotary probe 1A is mounted on the printed circuit board 1' shown in FIG. 3. When the outer frame 2 is rotated, the lead 9 is rotated about the probing jack 6 together with the outer frame 2. Hence, the signal input terminal 7 can come into contact with any one of the observation (i.e., monitoring) through holes 11c formed on the printed circuit board.

A description will now be given, with reference to FIGS. 6, 7, 8A and 8B, of a rotary probe 1B according to a third embodiment of the present invention. In these figures, parts that are the same as those shown in the previously described figures are given the same reference numerals. The rotary probe 1B includes an outer frame 2a, an inner frame 2b, electrically insulating members 3a, 3b and 3a', a ground supply terminal 4a, a ground supply metallic layer 4b, and signal input terminals 7a and 7b with respectively associated leads 9a and 9b and lead guides 10a and 10b.

The outer frame 2a, which is made up of an electrically insulating material, has a cylindrical portion 2a-1 and a disk-shaped flange portion 2a-2 extending radially from the lower end of the cylindrical portion. The insulating member 3a is disposed inside the cylindrical portion 2a-1 of the outer frame 2a. The cylindrical insulating member 3a has an appropriate thickness. The outer frame 2a is rotatable with respect to the insulating member 3a, and can be rotated in the same manner as a range switching knob of an oscilloscope.

The cylindrical inner frame 2b made of an electrically insulating substance is disposed inside the insulating member 3a. The cylindrical insulating member 3a' is located inside the inner frame 2b. A cylindrical hole is formed in the center of the cylindrical insulating member 3a'. The metallic ground supply layer 4b is formed on the inner wall of the hole. The insulating member 3b covers the bottom of the hole. The inner frame 2b is sandwiched between the insulating member 3a and the insulating member 3a', and can be rotated in the same manner as the range switching knob of an oscilloscope.

The hole formed in the center of the insulating member 3a' serves as the probe socket 5. The ground supply terminal 4a extends from the ground supply metallic layer 4b of the probe socket 5 to the outside of the outer frame 2a via the insulating member 3a'. Hence, it is easy to set the ground supply metallic layer 4b to the ground potential. The probing jack 6 penetrates the center of the insulating member 3b of the probe socket 5, and is fixed to the insulating member 3b. When the probe of the measuring device is inserted into the probe socket 5, the outside ground part of the probe of the measuring device comes into contact with the ground supply metallic layer 4b, and the needle part thereof comes into contact with the probing jack 6.

The lead 9a is rotatably connected to the probing jack 6, and the lead 9b is also rotatably connected to the probing jack 6. The lead guide 10b is fixed to the lowermost end of the inner frame 2b and the lead 9b includes a portion 9b' which passes through the lead guide 10b. An intermediate part 9b" (FIG. 6) of the lead 9b is bent and makes contact with the disk-shaped flange portion 2a-2 of the outer frame 2a. The bent portion 9b' of the lead 9b functions as an application point, and presses the signal input terminal 7b against the observation (monitoring point) through hole 11c (which may be a via hole or land; see FIG. 3). An observation (i.e., monitoring) signal obtained at the through hole 11c is transferred to the probe of the measuring device via the lead 9b and the probing jack 6 into which the measuring device probe is inserted.

The lead 9a is positioned a few millimeters lower than the lead 9b. The signal input terminal 7a is formed at the end portion of the lead 9a. Further, the end of the lead 9a is fixed to the peripheral edge of the disk-shaped flange portion 2a-2 of the outer frame 2a. By strongly pressing the signal input terminal 7a against the observation (i.e., monitoring) through hole 11c (which may be a via hole or a land), an observation signal obtained at the through hole 11c can be transferred to the probe of the measuring device via the lead 9a and the probing jack 6 into which the above probe is inserted.

Figure 6:
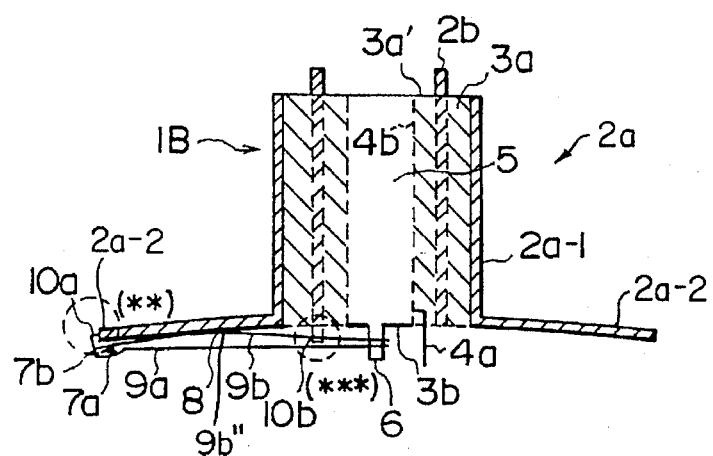
FIG. 6 is a cross-sectional view of a rotary probe according to a third embodiment of the present invention.
Figure 7:
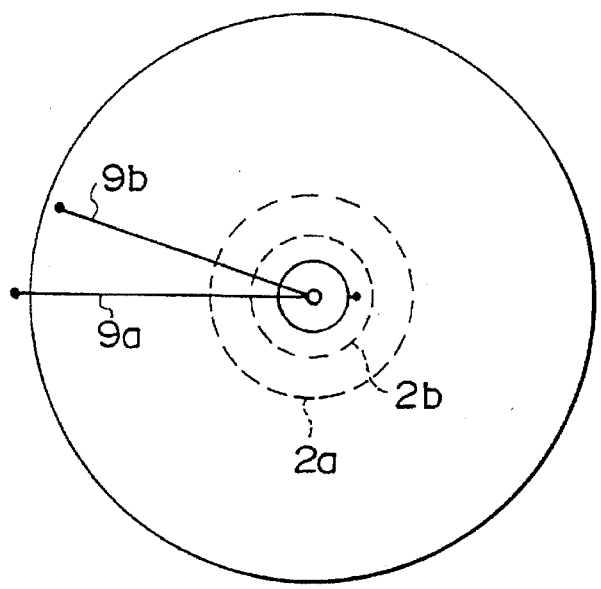
FIG. 7 is a bottom view of the rotary probe shown in FIG. 6.
Figure 8A:
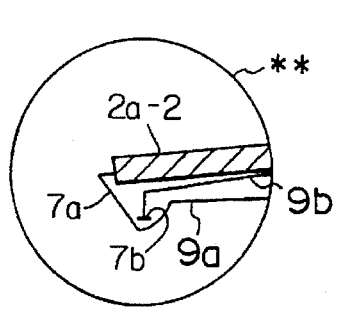
FIG. 8A is a diagram of a part of the rotary probe shown in FIGS. 6 and 7.
Figure 8B:
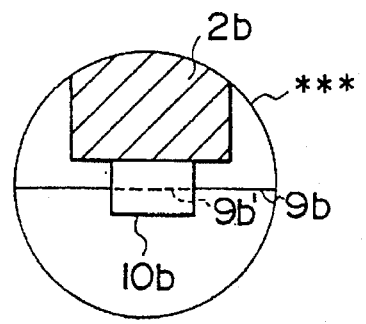
FIG. 8B is a diagram of another part of the rotary probe shown in FIGS. 6 and 7.

Referring to FIG. 8A, which is an enlarged side view of a part  encompassed by a dashed circular line and including signal input terminals 7a, 7b, in FIG. 6, the end portion of the lead 9a has a curved portion defining terminal 7a which comes into contact with the target through hole 11c. More specifically, the end portion terminal 7a of the lead 9a is bent outwardly and downwardly. Next, the end portion terminal 7a of the lead 9a is bent outwardly and upwardly, and is then bent inwardly. Finally, the free end of the lead 9a is inserted into the peripheral edge of the disk-shaped flange portion 2a-2 of the outer frame. Referring to FIG. 8B, which is an enlarged side view of a part * encompassed by a dashed circular line in FIG. 6, the lead 9b includes a portion 9b' which is inserted into and held by the lead guide 10b which, in turn, is fixed to the inner frame 2b.

The rotary probe 1B according to the third embodiment of the present invention is mounted on the printed circuit board 1' shown in FIG. 3. When the outer frame 2a of the rotary probe 1B is rotated, like the range switching knob of an oscilloscope, the lead 9a is rotated about the probing jack 6, and the signal input terminal 7a is allowed to come into contact with any one of the observation (monitoring point) through holes 11c.

The operator rotates the inner frame 2b while pressing it down. In this state, the lead guide 10b functions as the application point for the lead 9b, and the point 8 functions as a support point. Hence, the signal input terminal 7b is floated, so that the rotary switching operation can be easily performed. By pulling up the inner frame 2b, the reverse function takes place and the signal input terminal 7b is made to come into strong, firm contact with the desired observation (i.e., monitoring) through hole 11c (which may be a via hole or land).

A description will now be given of the method of using the leads 9a and 9b. The lead 9a is connected to the output of a device to be measured, and the lead 9b is connected to a printed wiring line of a circuit to be measured. Thereby, observation (i.e., monitoring) of a mounted system can be performed. For example, the above operating method is suitably applied to a case where a signal line on which there is a signal reflection is connected on the output side of a device to be measured. By using both the leads 9a and 9b in such a case, the output waveform can be observed.

Figure 9:
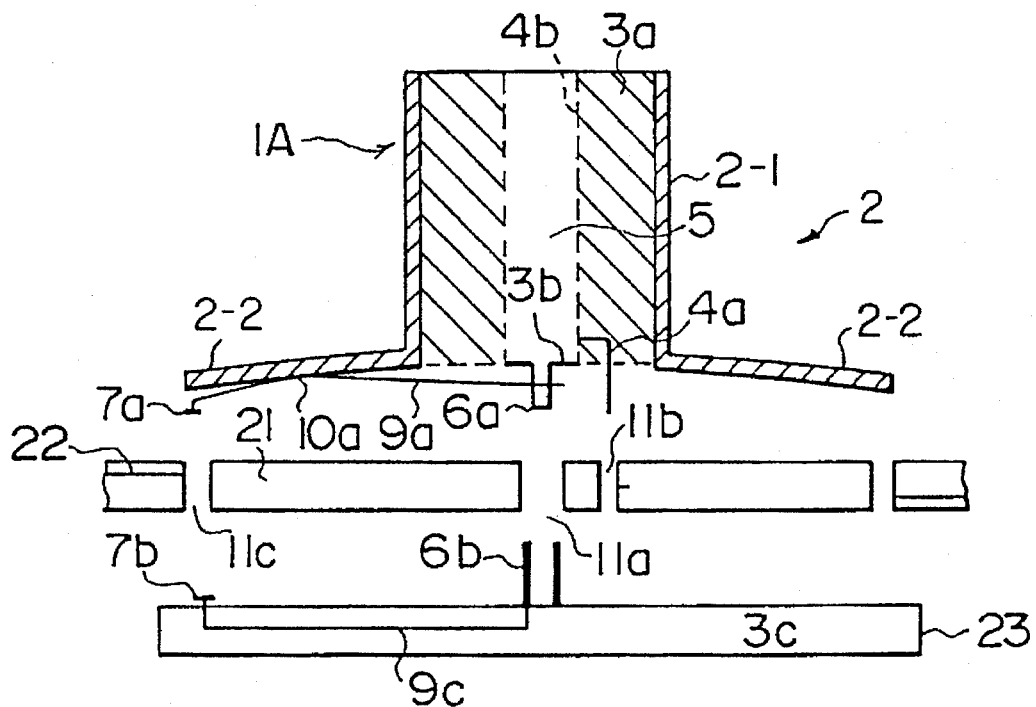
FIG. 9 is a diagram showing a combination of the rotary probe according to the second embodiment of the present invention and an under wheel.

FIG. 9 shows an example of combinations of the rotary probe of the present invention and an under wheel. The rotary probe 1A shown in FIG. 9 is the same as that shown in FIGS. 4A and 4B. In FIG. 9, reference numerals 6a and 7a indicate the probing jack and the signal input terminal, respectively. Reference numerals 9a and 10a indicate the lead and the lead guide, respectively.

A printed circuit board 21 shown in FIG. 9 is almost the same as the printed circuit board 1' shown in FIG. 3 except for the size of the through hole 11a. More specifically, the through hole 11a of the printed circuit board 21 is larger than that of the printed circuit board shown in FIG. 3.

An under wheel 23, which is also a circuit board, has a plate-shaped electrically insulating member 3c. A probing jack socket 6b is attached to the upper surface of the insulating member 3c so that the socket 6b stands upright. The probing jack socket 6b of the under wheel 23 is inserted into the through hole 11a of the printed circuit board 21. The probing jack socket 6a of the rotary probe 1A is inserted into the probing jack socket 6b.

The signal input terminal 7b is attached to the upper surface of the plate-shaped insulating member 3c. The distance between the probing jack socket 6b and the signal input terminal 7b is the same as the distance between the probing jack 6a and the signal input terminal 7a. An inner lead 9c connects the probing jack socket 6b and the signal input terminal 7b.

At the commencement of the measuring operation, the probing jack socket 6b of the under wheel 23 is inserted into the through hole 11a of the printed circuit board 21. Next, the probing jack 6a of the rotary probe 1A is inserted into the probing jack socket 6b, and the ground supply terminal 4a of the rotary probe 1A is inserted into the through hole 11b. Thereby, the rotary probe 1A is mounted on the printed circuit board 21.

In this state, the outer frame 2 is rotated so that the signal input terminal 7a comes into contact with the desired through hole 11c. Then, the under wheel 23 is rotated so that the signal input terminal 7b comes into contact with another desired one of the through holes 11c. For example, the signal input terminal 7a is connected to the output terminal of a device to be measured, and the signal input terminal 7b is connected to a printed wiring line of a circuit to be measured. In this manner, an observation of a mounted system is made possible.

Figure 10:
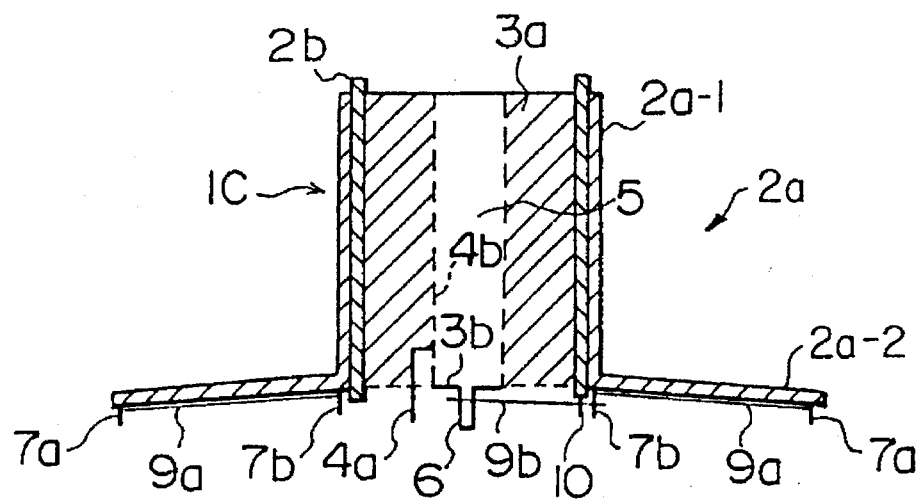
FIG. 10 is a cross-sectional view of a rotary probe according to a fourth embodiment of the present invention.
Figure 11:
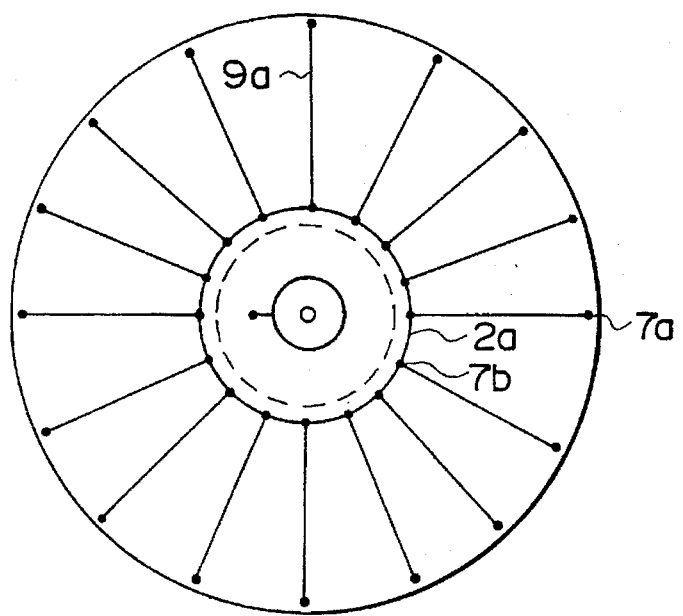
FIG. 11 is a bottom view of the rotary probe according to the fourth embodiment of the present invention.

A description will now be given, with reference to FIGS. 10 and 11, of a rotary probe 1C according to a fourth embodiment of the present invention. In these figures, parts that are the same as those shown in the previously described figures are given the same reference numerals.

The rotary probe 1C has an outer frame 2a made of an electrically insulating member. The outer frame 2a is made up of a cylindrical portion 2a-1 and a disk-shaped flange portion 2a-2 located on the lower end of the cylindrical portion. As clearly shown in FIG. 11, N signal input terminals 7a of a pin shape are provided on the circumferential (i.e., peripheral) edge portion of the disk-shaped flange portion 2a-2 of the outer frame 2a, where N is an integer equal to or greater than 2. Further, N signal input terminals 7b are provided in the vicinity of the integral connecting joint of the cylindrical portion 2a-1 and the disk-shaped flange portion 2a-2. The signal input terminals 7a respectively correspond to the signal input terminals 7b (i.e., one by one). The signal input terminals 7a are connected to the corresponding signal input terminals 7b by means of respective leads 9a, radially arranged.

The cylindrical inner frame 2b made of an electrically insulating member is disposed concentrically inside the outer frame 2a. The cylindrical insulating member 3a is disposed concentrically inside the inner frame 2b. The inner frame 2b is rotatable, relatively to and between the outer frame 2a and the insulating member 3a, and can be rotated like the range switching knob of an oscilloscope.

A cylindrical hole is formed in the center of the insulating member 3a. The ground supply metallic layer 4b is formed on the inner wall of the insulating member 3a. This hole serves as the probe socket 5. The insulating member 3b covers the bottom of the probe socket 5. The probing jack 6 penetrates the center of the insulating member 3b, and is fixed to the insulating member 3b. The ground supply terminal 4a extends from the metallic ground supply layer 4b to the outside of the outer frame 2a. It is easy to set the metallic ground supply layer 4a to the ground potential.

One end of the lead 9b is rotatably attached to the probing jack 6. The other end of the lead 9b penetrates the lead guide 10, which is fixed to the lowermost end of the inner frame 2b. The lead 9b is made of an electrically conducting metallic flexible substance such as copper or gold. When the inner frame 2b is rotated, the outer end of the lead 9b is hooked by one of the signal input terminals 7b. By further rotating the inner frame 2b, the lead 9b is bent and is released from the signal input terminal 7b. Then, the outer end of the lead 9b is hooked by the next signal input terminal 7b.

According to the fourth embodiment of the present invention, the leads 9a are stationary, while the single wire 9b is rotated by turning the inner frame 2b. The single wire 9b makes contact with the leads 9a, one by one.

Figure 12:
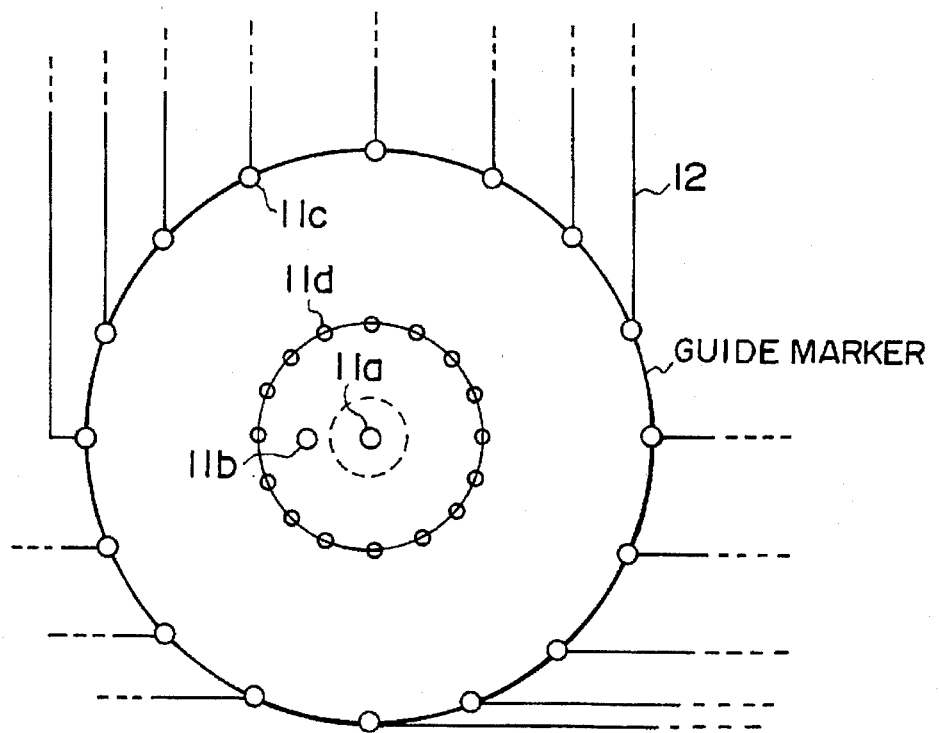
FIG. 12 is a plan view of a part of a printed circuit board suitable for the rotary probe according to the fourth embodiment of the present invention and also to another embodiment thereof.

FIG. 12 is a plan view of a part of a printed circuit board 1" suitable for mounting the rotary probe 1C according to the fourth embodiment of the present invention. In FIG. 12, parts that are the same as those shown in the previously described figures are given the same reference numerals.

The printed circuit board 1" shown in FIG. 12 includes the through hole 11a, the ground through hole 11b, a plurality of observation (i.e., monitoring) through holes 11c, through holes 11d for inputting signals, and printed wiring lines 12.

The probing jack 6 of the rotary probe 1C is inserted into the through hole 11a, and the ground supply terminal 4a is inserted into the ground through hole 11b. The signal input terminals 7b are inserted into the through holes 11d, and the signal input terminals 7a are inserted into the observation (i.e., monitoring) through holes 11c. The printed wiring lines 12 extending from the observation (i.e., monitoring) through holes 11c are connected to respective measurement parts. Instead of the observation through holes 11c, via holes or lands may be used.

Figure 13:
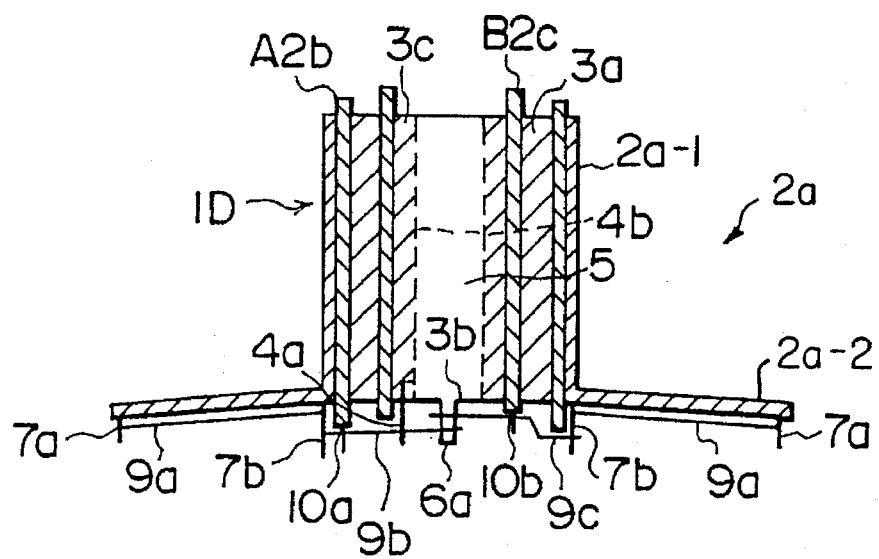
FIG. 13 is a cross-sectional view of a rotary probe according to a fifth embodiment of the present invention.
Figure 14:
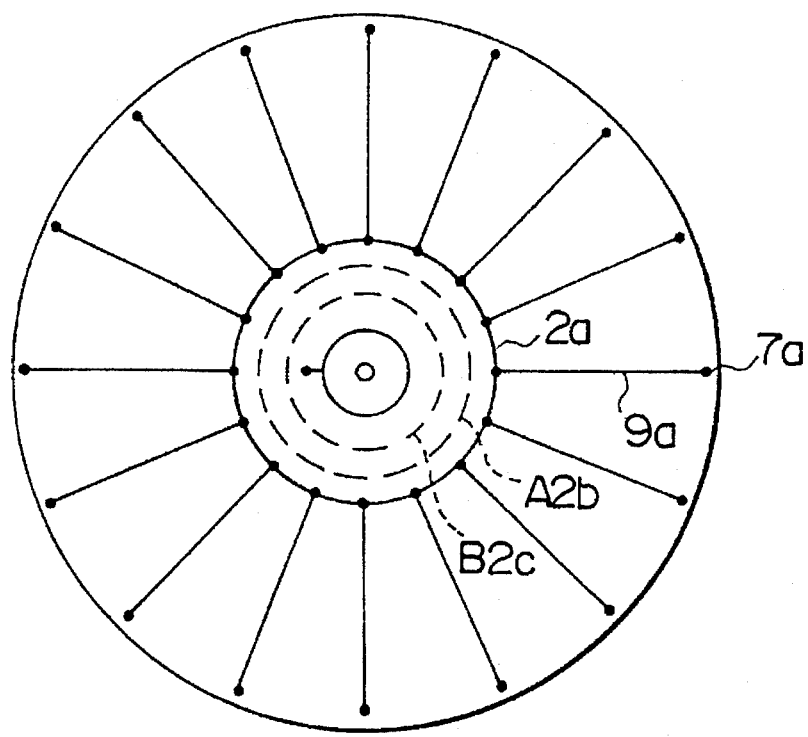
FIG. 14 is a bottom view of the rotary probe according to the fifth embodiment of the present invention.

A description will now be given, with reference to FIGS. 13 and 14, of a rotary probe 1D according to a fifth embodiment of the present invention. In FIG. 13, parts that are the same as those shown in the previously described figures are given the same reference numerals.

The rotary probe 1D includes the outer frame 2a, inner frames A2b and B2c, the insulating members 3a through 3c, the ground supply terminal 4a, the metallic ground supply layer 4b, the probe socket 5, the probing jack 6a, the signal input terminals 7a and 7b, the leads 9a through 9c, and the lead guides 10a and 10b. The outer frame 2a is made of an electrically insulating material. The outer frame 2a includes a cylindrical portion 2a-1 and a disk-shaped flange portion 2a-2 located on the lower end of the cylindrical portion. The cylindrical inner frame A2b made of an electrically insulating member is provided coaxially inside the outer frame 2a. The cylindrical insulating member 3a is disposed coaxially inside the inner frame A2b, which is rotatable. The cylindrical inner frame B2c is provided coaxially inside the insulating member 3a, and the cylindrical insulating member 3c is provided coaxially inside the inner frame B2c, which is rotatable.

A cylindrical hole is formed in the center of the cylindrical insulating member 3c, and the metallic ground supply layer 4b is formed on the inner wall of the cylindrical insulating member 3c. The inner wall with the metallic ground supply layer 4b serves as the probe socket 5. The insulating member 3b covers the bottom of the probe socket 5, and the probing jack 6a penetrates the center of the insulating member 3b. The probing jack 6a is fixed to the insulating member 3b. The ground supply terminal 4a extends from the metallic ground supply layer 4b to the outside of the outer frame 2a. With this structure, it is easy to set the metallic ground supply layer 4b to the ground potential.

The N signal input terminals 7a are provided on the peripheral edge portion of the disk-shaped flange portion of the outer frame 2a where N is an integer equal to or greater than 2. Further, the N signal input terminals 7b are provided in the vicinity of the joining position (i.e., connecting joint, or juncture) of the bottom and of the cylindrical portion 2a-1 and the disk-shaped flange portion 2a-2. The signal input terminals 7a respectively correspond to the signal input terminals 7b, one by one. The signal input terminals 7a are connected to the corresponding signal input terminals 7b by means of respective leads 9a.

One end of the lead 9b is rotatably attached to the probing jack 6a. The other end of the lead 9b penetrates the lead guide 10a, which is fixed to the lowermost end of the inner frame A2b. The lead 9b is made of an electrically conducting metallic flexible substance such as copper or gold. When the inner frame A2b is rotated, the outer end of the lead 9b is hooked by one of the signal input terminals 7b. By further rotating the inner frame A2b, the lead 9b is bent and is released from the signal input terminal 7b. Then, the outer end of the lead 9b is hooked by the next signal input terminal 7b.

One end of the lead 9c is rotatably attached to the probing jack 6a. The other end of the lead 9c penetrates the lead guide 10b, which is fixed to the lowermost end of the inner frame B2c. The lead 9c is made of an electrically conducting metallic flexible substance such as copper or gold. When the inner frame B2c is rotated, the outer end of the lead 9c is hooked by one of the signal input terminals 7b. By further rotating the inner frame B2c, the lead 9c is bent and is released from the signal input terminal 7b. Then, the outer end of the lead 9c is hooked by the next signal input terminal 7b.

The rotary probe 1D according to the fifth embodiment of the present invention is mounted on the printed circuit board 1" shown in FIG. 12. The probing jack 6a of the rotary probe 1D is inserted into the through hole 11a, and the ground supply terminal 4a is inserted into the ground through hole 11b. Further, the signal input terminals 7b are inserted into the through holes 11d, and the signal input terminals 7a are inserted into the observation through holes 11c.

The leads 9a are kept stationary while the leads 9b and 9c are rotatable and come into contact with the signal input terminals 7b of a pin shape.

FIG. 15 shows the combination of the rotary probe 1C according to the fourth embodiment of the present invention and the under wheel 23. In FIG. 15, parts that are the same as those shown in the previously described figures are given the same reference numerals. The rotary probe 1C includes the outer frame 2a, the inner frame 2b, the electrically insulating members 3a and 3b, the ground supply terminal 4a, the metallic ground supply layer 4b, the probe socket 5, the probing jack 6a, the signal input terminals 7a and 7b, the leads 9a and 9b, and the lead guide 10. The printed circuit board 21 includes through holes 11a, 11b, 11c and 11d, and the printed wiring lines 22. The under wheel 23 has the electrically insulating member 3c, the probing jack socket 6b and the inner wires 9c.

The probing jack socket 6b is inserted into the through hole 11a formed in the printed circuit board 21. The through hole 11b is formed in the printed circuit board 21 in the vicinity of the through hole 11a. The ground supply terminal 4a of the rotary probe 1 is inserted into the through hole 11b.

The N through holes 11d are formed around the through hole 11a of the printed circuit board 21. The N signal input terminals 7b of the rotary probe 1C are inserted into the corresponding through holes 11d. The N through holes 11c are arranged along a circle about the center of the through hole 11a of the printed circuit board 21. The N signal input terminals 7a of the rotary probe 1C are inserted into the corresponding through holes 11c, which are connected to the corresponding measurement points via the printed wiring lines 22.

The under wheel 23 has the plate-shaped insulating member 3c. The probing jack socket 6b is attached to the upper surface of the insulating member 3c so that the socket 6b stands upright. The probing jack socket 6b of the under wheel 23 is inserted into the through hole 11a of the printed circuit board 21. The probing jack socket 6a of the rotary probe 1C is inserted into the probing jack socket 6b.

The signal input terminal 7c is attached to the upper surface of the plate-shaped insulating member 3c. The distance between the probing jack socket 6b and the signal input terminal 7c is the same as the distance between the probing jack 6a and the signal input terminal 7b. The inner lead 9c connects the probing jack socket 6b and the signal input terminal 7c.

At the commencement of the measuring operation, the probing jack socket 6b of the under wheel 23 is inserted into the through hole 11a of the printed circuit board 21. Next, the probing jack 6a of the rotary probe 1C is inserted into the probing jack socket 6b, and the ground supply terminal 4a of the rotary probe 1C is inserted into the through hole 11b. The signal input terminals 7b are inserted into the through holes 11d, and the signal input terminals 7a are inserted into the through holes 11c. Thereby, the rotary probe 1C is mounted on the printed circuit board 21.

In this state, the inner frame 2b is rotated so that the lead 9b comes into contact with a desired signal input terminal 7b. Then, the under wheel 23 is rotated so that the signal input terminal 7c comes into contact with another desired through hole 11d. For example, the lead 9b is connected to the output terminal of a device to be measured, and the signal input terminal 7c is connected to a printed wiring line of a circuit to be measured. In this manner, an observation of a mounted system is made possible.

According to the present invention, the following advantages can be obtained.

First, it becomes possible to observe the arbitrarily selected circuit signal at a single point of observation (i.e., monitoring point) by means of the rotary probe. Hence, it is not necessary to connect the probe of the measuring device to the measurement points, one by one. As a result, it becomes possible to efficiently measure the circuits in a reduced time.

Second, the accuracy of measurement can be improved because the rotary switch and the probe socket are unified. It is to be noted that the conventional art needs a few centimeters distance between the rotary switch and the probe of the measuring device and that this distance degrades the accuracy of measurement.

Third, it is possible to arbitrarily select the measurement points, one by one, by switching the rotary switch of the rotary probe. Hence, it is no longer necessary to manually provide Teflon or enamel wires extending from the measurement points to the observation point.

The present invention is not limited to the specifically disclosed embodiments, and variations and modifications may be made without departing from the scope of the present invention.

What is claimed is:

1. A rotary probe mounted on a circuit board and used to connect a selected circuit, of plural circuits of the circuit board, to an external device, said rotary probe comprising:

an outer frame having a flange portion facing the circuit board;

a first lead extending along the flange portion and having a signal input terminal at a first end thereof and being supported at a second end thereof so as to be rotatable with respect to the circuit board, the signal input terminal being selectively connectable to a selected, individual circuit of the plural circuits of the circuit board by selectively rotating the first lead;

a probing jack electrically connected to said first lead, and connectable to a corresponding terminal formed on the circuit board; and a ground supply terminal mounted to the rotary probe and projecting in electrically insulated relationship from the outer frame of the rotary probe toward, and being connectable to a corresponding ground terminal formed on, the circuit board.

2. The rotary probe as claimed in claim 1, wherein:

said first lead has a portion at the second end thereof which is in contact with the probing jack;

said first lead is rotatable about the probing jack; and said first lead has a bent portion at an intermediate position thereof which is in contact with the flange portion and thereby urges the signal input terminal, at the first end of the first lead, toward the circuit board.

3. The rotary probe as claimed in claim 2, wherein said first lead has a curved portion that projects away from an outer peripheral edge of the flange portion and thereby is accessible for manually exerting a force on said curved portion for rotating said first lead.

4. The rotary probe as claimed in claim 2 wherein the outer frame includes an upright portion having a lower end connected to the flange portion and extending outwardly therefrom, away from the circuit board, the upright portion having a corresponding, first hollow interior portion, the rotary probe further comprising:

a first insulating member provided in the hollow interior of the upright portion of the outer frame and having a corresponding, second hollow interior portion and defining an interior sidewall;

a metallic layer formed on the interior sidewall of the second hollow interior portion of first insulating member, said ground supply terminal penetrating and extending through the first insulating member to said metallic layer and being connected thereto; and said second, hollow interior portion of the first insulating member being adapted for receiving therein an external probe having a signal terminal so that the signal terminal of said external probe comes into contact with said probing jack and a ground terminal of said external probe comes into contact with said metallic layer.

5. The rotary probe as claimed in claim 4, further comprising:

a second insulating member supporting said probing jack; and said second insulating member being attached to said first insulating member.

6. The rotary probe as claimed in claim 1, further comprising:

a lead guide attached to said flange portion;

said first lead transversely penetrating said lead guide so that an intermediate portion of said first lead is substantially fixed by said lead guide to said flange portion of said outer frame; and said first lead being rotatable relatively to the circuit board by turning the outer frame.

7. The rotary probe as claimed in claim 6, wherein:

said first lead has a portion at the second end thereof which is in contact with the probing jack; and said first lead has a bent portion at an intermediate portion thereof which is in contact with the flange portion and thereby urges the signal input terminal, at the first end of the first lead, toward the circuit board.

8. The rotary probe as claimed in claim 1, further comprising:

an inner frame rotatably mounted in a hollow portion of the outer frame; and said first lead being fixed to said inner frame and being rotatable therewith by turning said inner frame.

9. The rotary probe as claimed in claim 8, wherein:

said first lead has a portion at the second end thereof which is in contact with the probing jack; and said first lead has a bent portion at an intermediate portion thereof which is in contact with the flange portion and thereby urges the signal input terminal, at the first end of the first lead, toward the circuit board.

10. The rotary probe as claimed in claim 9, further comprising a second lead extending along the flange portion and having a corresponding, second signal input terminal at a first end thereof and said second lead being connected at a second end thereof to said probing jack and having a portion fixed to an end of the flange portion of the outer frame so that the second lead can be rotated by turning the outer frame relatively to the circuit board.

11. The rotary probe as claimed in claim 8, further comprising:

a first insulating member which is provided in the hollow portion of the outer frame and has a corresponding, second hollow interior portion which accommodates the inner frame;

a metallic layer formed on the first insulating member, said ground supply terminal penetrating the first insulating member and being connected to said metallic layer; and said second hollow interior portion of the first insulating member being adapted for receiving therein an external probe having a signal terminal so that the signal terminal of said probe comes into contact with said probing jack and a ground terminal of said external probe comes into contact with said metallic layer.

12. The rotary probe as claimed in claim 11, further comprising:

a second insulating member supporting said probing jack; and said second insulating member being attached to said first insulating member.

13. The rotary probe as claimed in claim 10, wherein said second lead has a curved portion which is movable so as to come selectively into contact with selected circuit parts, one by one, when the rotary probe is mounted on the circuit board and rotated with respect thereto.

14. The rotary probe as claimed in claim 1, wherein the outer frame has a cylindrical portion having a lower end, the flange portion has a disk shape with an interior circular perimeter and the lower end of the cylindrical portion is connected to the interior circular perimeter of the flange portion of the outer frame and projects outwardly from the flange portion, relatively to the circuit board.

15. A rotary probe mounted on a circuit board and used to connect a second circuit, of plural circuits of the circuit board, to an external device, said rotary probe comprising:

an outer frame having a flange portion facing the circuit board and an upright portion having a hollow interior and connected to the flange portion and projecting away from the circuit board;

a first inner frame rotatably provided in the hollow interior of the upright portion of the outer frame;

first leads extending along the flange portion and being connected to first and second terminals supported by the flange portion;

a second lead fixed to the first inner frame;

a probing jack connected to said second lead and selectively connectable to a corresponding terminal formed on the circuit board, said second lead being rotated about the probing jack by turning the first inner frame and thereby coming into contact with the first terminals, one by one; and a ground supply terminal projecting from the outer flange of the outer frame and toward the circuit board and being connectable to a corresponding ground terminal formed on the circuit board.

16. The rotary probe as claimed in claim 15, wherein the first leads are radially arranged relatively to the probing jack.

17. The rotary probe as claimed in claim 15, wherein:

a first insulating member is provided in a hollow portion of the first inner frame;

a metallic layer is formed on the first insulating member, said ground supply terminal penetrating the first insulating member and being connected to said metallic layer; and said second, hollow interior portion of the first insulating member being adapted for receiving therein an external probe having a signal terminal so that the signal terminal of said external probe comes into contact with said probing jack and a ground terminal of said external probe comes into contact with said metallic layer.

18. The rotary probe as claimed in claim 17, further comprising:

a second insulating member supporting said probing jack; and said second insulating member being attached to said first insulating member.

19. The rotary probe as claimed in claim 15, wherein the first and second terminals are each of a pin shape.

20. The rotary probe as claimed in claim 15, further comprising:

a second inner wall rotatably provided in a hollow portion of the first inner wall; and a third lead fixed to the second inner frame and connected to the probing jack, said third lead being rotated, in common with the second inner frame and about the probing jack, by turning the second inner frame and thereby coming into contact selectively with the first terminals, one by one.

21. The rotary probe as claimed in claim 20, further comprising:

a first insulating member provided in a hollow portion of the first inner frame and supporting the second insulating frame;

a metallic layer formed on the first insulating member, said ground supply terminal penetrating the first insulating member and being connected to said metallic layer; and said second, hollow interior portion of the first insulating member being adapted for receiving therein an external probe having a signal terminal so that the signal terminal of said external probe comes into contact with said probing jack and a ground terminal of said external probe comes into contact with said metallic layer.

22. The rotary probe as claimed in claim 21, further comprising:

a second insulating member supporting said probing jack; and said second insulating member being attached to said first insulating member.

23. A circuit board assemblage, comprising:

a rotary probe mounted on a circuit board and comprising:

an outer frame having a flange portion facing the circuit board;

a first lead extending along the flange portion and having a signal input terminal and being supported so as to be rotatable with respect to the circuit board, the signal input terminal being connectable to parts of the circuit of the circuit board one by one by rotating the first lead;

a probing jack connected to said first lead and connectable to a corresponding probing jack socket formed on the circuit board; and a ground supply terminal projecting from the outer frame and being connectable to a corresponding ground terminal formed on the circuit board; and said circuit board comprising:

a plurality of terminals formed on a board and arranged on an imaginary curved line along which said signal input terminal travels by rotating said lead;

wiring lines connecting said plurality of terminals to the circuit of the circuit board;

a first hole formed in the circuit board, said probing jack being inserted into the first hole, and a second hole formed in the circuit board, said ground supply terminal being inserted into the second hole.

24. The circuit board as claimed in claim 23, wherein said plurality of terminals is positioned in a circular arrangement.

25. A circuit board assemblage comprising:

a rotary probe mounted on a circuit board and comprising:

an outer frame having a flange portion facing the circuit board and an upright portion having a hollow interior and connected to the flange portion and projecting away from the circuit board;

a first inner frame rotatably provided in the hollow interior of the upright portion of the outer frame;

first leads extending along the flange portion and being connected to first and second terminals supported by the flange portion;

a second lead fixed to the first inner frame;

a probing jack connected to said second lead and selectively connectable to a corresponding terminal formed on the circuit board, said second lead being rotated about the probing jack by turning the first inner frame and thereby coming into contact with the first terminals, one by one; and a ground supply terminal projecting from the outer flange of the outer frame and toward the circuit board and being connectable to a corresponding ground terminal formed on the circuit board; and said circuit board further comprising:

a plurality of third terminals formed thereon and located at positions corresponding to the first terminals;

a plurality of fourth terminals formed thereon and located at positions corresponding to the second terminals;

wiring lines connecting said plurality of fourth terminals to circuits of the circuit board;

a first hole formed in the circuit board, said probing jack being inserted into the first hole; and a second hole formed in the circuit board, said ground supply terminal being inserted into the second hole.

26. The circuit board as claimed in claim 25, wherein:

the plurality of third terminals is positioned in a circular arrangement, closer to the first hole than the plurality of fourth terminals; and the plurality of fourth terminals is positioned in a circular arrangement surrounding the plurality of third terminals.

27. A connecting device comprising:

a rotary probe mounted on a circuit board and used to connect a selected circuit of a plurality of circuits of the circuit board to an external device, the circuit board having first and second, opposite sides; and an under wheel located on a first side of the circuit board, said rotary probe being located on a second side of the circuit board, opposite to the first side, said rotary probe comprising:

an outer frame having a flange portion facing the circuit board, a first lead extending along the flange portion and having a first signal input terminal at a first end thereof and being connectable to a selected circuit of the plurality of circuits of the circuit board and being supported at a second end thereof so as to be rotatable with respect to the circuit board, a probing jack connected to said first lead, and a ground supply terminal mounted to the rotary probe and projecting in electrically insulated relationship from the outer frame of the rotary probe toward, and being connectable to a corresponding ground terminal formed on, the circuit board; and said under wheel further comprising:

a second signal input terminal connectable to another part of the circuit of the circuit board, a probing jack socket connectable to said probing jack through the circuit board, and an inner lead connecting the second signal input terminal and the probing jack socket.

28. A connecting device comprising:

a rotary probe mounted on a circuit board and used to connect a selected circuit, of plural circuits of the circuit board, to an external device;

an under wheel located on a first side of the circuit board; and said rotary probe being located on a second side of the circuit board, opposite to the first side, and further comprising:

an outer frame having a flange portion facing the circuit board, a first inner frame rotatably mounted in a hollow portion of the outer frame, first leads extending along the flange portion and being connected to first and second terminals supported by the flange portion;

a second lead fixed to the first inner frame;

a probing jack connected to said second lead and selectively connectable to a corresponding terminal formed on the circuit board, said second lead being rotated about the probing jack, commonly with the first inner frame, by turning the first inner frame and thereby coming selectively into contact with the first terminals, one by one; and a ground supply terminal projecting from the outer frame and being connectable to a corresponding ground terminal formed on the circuit board; and said under wheel further comprising:

a signal input terminal connectable to another part of the circuit of the circuit board;

a probing jack socket connectable to said probing jack through the circuit board; and an inner lead connecting the signal input terminal and the probing jack socket.

* * * * *